United States Patent
Jutte et al.

(10) Patent No.: US 11,217,967 B2
(45) Date of Patent: Jan. 4, 2022

(54) LASER ARRANGEMENT WITH REDUCED BUILDING HEIGHT

(71) Applicant: TRUMPF Photonic Components GmbH, Ulm (DE)

(72) Inventors: Petrus Theodorus Jutte, Ulm (DE); Pascal Jean Henri Bloemen, Ulm (DE); Stephan Gronenborn, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 0 days.

(21) Appl. No.: 17/148,604

(22) Filed: Jan. 14, 2021

(65) Prior Publication Data
US 2021/0143611 A1 May 13, 2021

Related U.S. Application Data

(63) Continuation of application No. PCT/EP2019/068380, filed on Jul. 9, 2019.

(30) Foreign Application Priority Data

Jul. 17, 2018 (EP) .................... 18183832

(51) Int. Cl.
*H01S 5/42* (2006.01)
*H01S 5/00* (2006.01)
(Continued)

(52) U.S. Cl.
CPC ............ *H01S 5/423* (2013.01); *G02B 5/0221* (2013.01); *G02B 5/0278* (2013.01);
(Continued)

(58) Field of Classification Search
CPC ....... H01S 5/40–4093; H01S 5/42–423; H01S 5/183–187; H01S 5/18388; H01S 5/005;
(Continued)

(56) References Cited

U.S. PATENT DOCUMENTS 10,965,103 B2 * 3/2021 Gronenborn ............ H01S 5/423
2004/0130790 A1 7/2004 Sales
(Continued)

FOREIGN PATENT DOCUMENTS

| WO | WO 2011021140 A8 | 3/2012 |
| WO | WO 2017055160 A1 | 4/2017 |
| WO | WO 2017204748 A1 | 11/2017 |

OTHER PUBLICATIONS

Moench, et al., "High Power VCSEL Systems for Tailored Intensity Distributions," *Vertical-Cavity Surface-Emitting Lasers* 7952, 1:1-11 (Feb. 10, 2011).

*Primary Examiner* — Minsun O Harvey
*Assistant Examiner* — Delma R Fordé
(74) *Attorney, Agent, or Firm* — Leydig, Voit & Mayer, Ltd.

(57) ABSTRACT

A laser arrangement includes a laser array, and an optical arrangement. The laser array includes lasers in a first pattern emitting a same laser emission profile around a first optical axis with a divergence angle θ/2. The optical arrangement has a diffusor with an array of optical elements in a second pattern, with a second optical axis, and with an illumination pattern along a first illumination axis in a field-of-view if laser light is received within a defined range smaller than or equal to a range of angles between −/+θ with respect to the second optical axis. A row of lasers parallel to the first illumination axis has a pitch p. A row of m optical elements is parallel to the first axis. Each optical element has a diameter L, and contacts its neighbor. The n lasers and the m optical elements satisfy n*p=m*L with a deviation smaller than +/−5%.

19 Claims, 14 Drawing Sheets

(51) Int. Cl.
*G02B 5/02* (2006.01)
*G02B 19/00* (2006.01)
*G02B 27/09* (2006.01)
*H01S 5/022* (2021.01)
*H01S 5/183* (2006.01)
*H01S 5/40* (2006.01)

(52) U.S. Cl.
CPC ..... *G02B 19/0052* (2013.01); *G02B 19/0057* (2013.01); *G02B 27/0916* (2013.01); *G02B 27/0922* (2013.01); *H01S 5/005* (2013.01); *H01S 5/022* (2013.01); *H01S 5/18388* (2013.01); *H01S 5/40* (2013.01); *H01S 5/4012* (2013.01); *H01S 5/4093* (2013.01); *H01S 5/42* (2013.01); *H01S 2301/18* (2013.01); *H01S 2301/20* (2013.01)

(58) Field of Classification Search
CPC .. H01S 5/8305; H01S 5/0207; H01S 2301/18; H01S 2301/20; G02B 19/0052; G02B 19/0057; G02B 27/0916; G02B 27/0922; G02B 27/0905; G02B 27/0927; G02B 6/4204

See application file for complete search history.

(56) References Cited

U.S. PATENT DOCUMENTS

| | | | |
|---|---|---|---|
| 2007/0071056 A1* | 3/2007 | Chen | G01S 17/87 372/50.124 |
| 2008/0273557 A1 | 11/2008 | Bloom | |
| 2010/0045894 A1* | 2/2010 | Itoh | G02B 6/0046 349/61 |
| 2012/0281293 A1* | 11/2012 | Gronenborn | H01S 5/423 359/619 |
| 2015/0108371 A1* | 4/2015 | Gronenborn | B23K 26/0006 250/492.1 |
| 2016/0164261 A1* | 6/2016 | Warren | H01S 5/026 348/164 |
| 2016/0279707 A1* | 9/2016 | Mattes | H01S 5/423 |
| 2020/0028329 A1* | 1/2020 | Gronenborn | H01S 5/026 |
| 2020/0335944 A1* | 10/2020 | Gronenborn | H01S 5/423 |

* cited by examiner

LASER ARRANGEMENT WITH REDUCED BUILDING HEIGHT

CROSS-REFERENCE TO PRIOR APPLICATIONS

This application is a continuation of International Patent Application No. PCT/EP2019/068380, filed on Jul. 9, 2019, which claims priority to European Patent Application No. EP 18 183 832.7, filed on Jul. 17, 2018. The entire disclosure of both applications is hereby incorporated by reference herein.

FIELD

The present invention relates to a laser arrangement comprising a laser array and especially a Vertical Cavity Surface Emitting Laser (VCSEL) array and a diffusor, a lighting device comprising such a laser or VCSEL array, a time-of-flight camera comprising such a laser arrangement or lighting device and a method of manufacturing the laser arrangement.

BACKGROUND

Laser arrangements comprising a laser and especially a VCSEL array can be used for infrared illumination devices. VCSEL arrays are, for example, applied in time-of-flight applications using short pulses. Such applications comprise, e.g., short-range gesture recognition for portable devices and 3D space recognition. VCSEL arrays of about 1 mm$^2$ area with output power in the 1-10 W range are discussed for such applications. A specific field of illumination or view is defined by the application (e.g. a time-of-flight camera observing e.g. 70°×50°). Specific diffusor structures are used in order to tailor the emission pattern towards the application requirement. Most VCSEL-based illumination modules use refractive diffusors.

US 2004/130790 A1 discloses in this respect a microlens arrays, which are defined with microlens elements that differ from each other in accordance with a probability distribution, for shaping an optical beam having a prescribed intensity profile within a desired far-field scatter pattern. The differences include random variations in a sag profile corresponding to a surface shape of the microlenses, a boundary profile corresponding to a boundary of the microlenses, and a spatial distribution corresponding to the relative position of the microlenses within the array.

US 2008/0273557 A1 discloses a phase plate and lens for modifying light beams emitted by an array of lasers.

WO 2011/021140 A8 discloses a laser device comprising an array of several large area VCSELs and one or several optics for imaging the active layers of the VCSELs to a working plane.

SUMMARY

An embodiment of the present invention provides a laser arrangement that includes a laser array, and an optical arrangement. The laser array includes a multitude of lasers arranged in a first regular pattern. Each laser, of the lasers, is arranged to emit a same laser emission profile around a first optical axis with a divergence angle θ/2 with respect to the first optical axis in at least one direction perpendicular to the first optical axis. The optical arrangement has a diffusor. The diffusor has an array of optical elements, which are arranged in a second regular pattern. Each of the optical elements has a second optical axis. Each of the optical elements is arranged to provide a defined illumination pattern along at least one first illumination axis in a reference plane in a defined field-of-view in a condition where laser light is received within a defined range of angles by each surface element of the respective optical element, of the optical elements. The defined range of angles is smaller than or equal to a range of angles between −θ and +θ, preferably between −θ/2 and +θ/2, with respect to the second optical axis. The lasers and the optical elements are arranged relative to each other such that the diffusor transforms the laser light received from the lasers to transformed light. An emission characteristic of the transformed light along the first illumination axis in the reference plane in the defined field-of-view is characterized by the same characteristics as the defined illumination pattern. At least one first row of lasers comprising at least n lasers, of the lasers, is arranged along a first axis parallel to the first illumination axis with a laser pitch p. At least one first row of optical elements comprising at least m optical elements, of the optical elements, is arranged parallel to the first axis. Each of the optical elements is characterized by a diameter L parallel to the first axis. Each of the optical elements is in physical contact with a neighboring optical element, of the optical elements, such that a total length of the first row of optical elements parallel to the first axis is given by a number of optical elements multiplied with the diameter L. The first row of optical elements is arranged to receive the laser light from the first row of lasers during operation of the first row of lasers. A diameter of the laser light emitted by the lasers along the first axis in a reference plane of the optical elements is given by Φ. The n lasers and the m optical elements fulfill a condition n*p=m*L with a deviation smaller than +/−5%.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
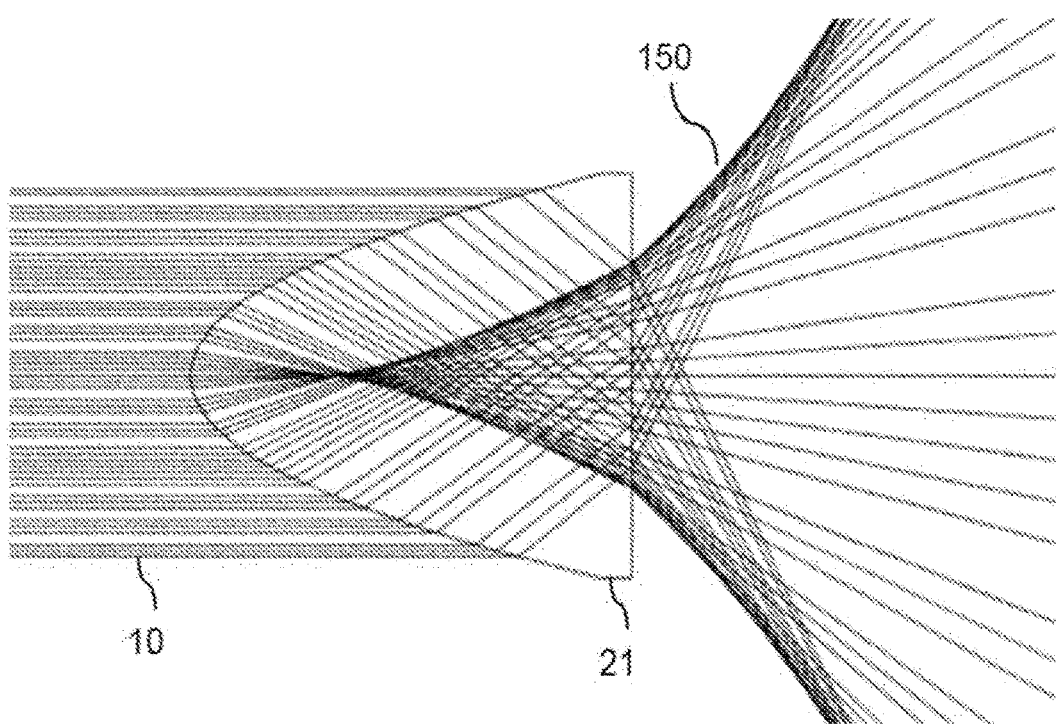
FIG. 1 shows a principal sketch of an optical element comprised by a diffusor.

Embodiments of the present invention provide a laser arrangement with reduced building height.

According to a first aspect of the present invention, a laser arrangement is provided. The laser arrangement comprises a laser array and an optical arrangement. The laser array comprises at a multitude of lasers arranged in a first regular pattern (e.g. linear, rectangular pattern and the like). Each laser is arranged to emit the same laser emission profile around a first optical axis with a divergence angle $\theta/2$ (with $\theta$ the full divergence angle given by the Full Width Half Maximum-FWHM of the laser emission profile in the at least one direction) with respect to the first optical axis in at least one direction perpendicular to the first optical axis. The laser emission profile may be characterized by two different full divergence angles in, for example, two perpendicular directions (e.g. elliptical beam). The optical arrangement comprises a diffusor. The diffusor comprises an array of optical elements arranged in a second regular pattern. Each optical element comprises a second optical axis. Each optical element is arranged to provide a defined illumination pattern along at least one first illumination axis in a reference plane in a defined field-of-view if laser light is received within a defined range of angles by each surface element of the respective optical element, wherein the defined range of angles is smaller than or equal to a range of angles between $-\theta$ and $+\theta$, preferably between $\theta/2$ and $+\theta/2$ with respect to the second optical axis. Each optical element may, according to a special embodiment, be arranged to provide a defined illumination pattern along at least one first illumination axis in a reference plane in a defined field-of-view if collimated laser light ($\theta=0$) is received, wherein the laser light is parallel to the second optical axis. The lasers and the optical elements are arranged relative to each other such that the diffusor transforms laser light received from the lasers to transformed light. An emission characteristic of the transformed light along the first illumination axis in the reference plane in the defined field-of-view is characterized by the same characteristics as the defined illumination pattern. The reference plane in the defined field-of-view is arranged in a defined distance to the laser arrangement and parallel to a plane of the light emission surfaces of the lasers. An optical element comprised by the array of optical elements may, for example, be a single conical lens or a free-form optic (e.g. comprising two lens elements) which fulfill the conditions given above or below.

State-of-the-art diffusors as described, for example, in US 2004/130790 A1 cited above use random arrangements of microlenses (random in diameter, decenter and position) to achieve the desired beam pattern (e.g. homogeneously illuminate a rectangle of 100°×80°) from a coherent, collimated beam. The beam has to illuminate a minimum area of the diffusor to illuminate enough microlenses to have enough randomization. A too small beam will result in inhomogeneities as only lenses with some shapes are illuminated while other shapes are not illuminated. Inhomogeneities can also occur if the diffusor is mounted very close to a laser array (e.g. VCSEL) as each lens is then illuminated by one or a few lasers under some specific angles or in the extreme case, some parts of the lenses are not illuminated at all. For applications, such as for example in smart phones, a low building height of the laser arrangement is a critical boundary condition so a large distance between laser and diffusor may not be possible.

The disclosed regular patterns of the lasers and the optical elements, e.g., the special shape of the optical elements in combination with the relative placement of the regular patterns with respect to each other, do have the effect that it is not necessary to illuminate a huge number of different structures of the diffusor to get a homogeneous illumination profile in an intended field-of-view. It is therefore possible to place the diffusor very near to the laser array such that there is only a slight overlap between the emission cones (characterized by the full divergence angle $\theta$ given by the Full Width Half Maximum-FWHM of the intensity distribution of the emitted laser light) of the laser light emitted by the lasers or even no overlap in a plane where the laser light starts to interact with the diffusor. The emission cone of a single laser may, for example, only overlap with emission cones of the next and after next laser, only overlap with the emission cone of the next laser or even overlap with the emission cone of no neighboring laser. The corresponding distance between laser array and diffusor depends on the pitch between two neighboring lasers and the full divergence angle. The pitch may, for example, be in case of a VCSEL array be between 30 µm and 50 µm, preferably 40 µm and the full divergence angle in air may be around 20°. A distance between a light emission surface of the lasers and a surface of the optical elements opposing a side of the optical elements receiving the laser light may, for example, be smaller than 300 µm, preferably smaller than 200 µm and most preferably smaller than 100 µm.

The emission characteristic may be smeared out depending on the size of the full divergence angle in comparison to the defined illumination pattern. The latter is caused by the fact that the optical elements or more specifically a surface element of one optical element receives laser light under different angles limited by the full divergence angle. The characteristics of the defined illumination pattern is no longer visible in the emission characteristic of the transformed light if the full divergence angle is equal to half of the angle of the field-of-view which may, for example, be characterized by a range of angles 70°×50°, 100°×80° and the like. The full divergence angle may therefore be smaller than 30°, more preferably smaller than 25°, and most preferably smaller than 21 in case of a such that a characteristic of the defined illumination pattern which would be emitted by a single optical element aligned with a single laser (e.g. essentially flat intensity profile along one axis in the defined field-of-view in a defined range of angles) is not changed. The emission characteristic may essentially be the same if the diffusor receives collimated laser light. The optical element design is such that the aperture of the optical element may, for example, be chosen such that an otherwise circular output of the lasers can be cropped by means of the diffusor to a rectangular beam having a desired horizontal-vertical field-of-view aspect ratio.

The laser arrangement may preferably be arranged such that the emission characteristic of the transformed light is essentially invariant with respect to a lateral shift between the lasers and the optical elements. The lateral shift is parallel to the first illumination axis. The lateral shift is limited by the lateral extension of the diffusor. All laser light emitted by the laser array has to be transformed by the diffusor. The laser arrangement is preferably arranged such that the emission characteristic of the transformed laser light is invariant with respect to a lateral shift parallel to the reference plane as long as the emitted laser light is essentially completely transformed by the diffusor. The laser arrangement may simplify mounting of the diffusor because lateral alignment of the regular pattern of lasers and optical elements may be simplified. Lateral shifts of several micrometers (e.g. 5 µm or 10 µm) may be acceptable depending on the lateral size of the diffusor.

The laser arrangement is arranged such that at least one first row of lasers comprising at least n lasers is arranged along a first axis parallel to the first illumination axis with a pitch p. At least one first row of optical elements comprising at least m optical elements is arranged parallel to the first axis. Each optical element is characterized by a diameter L parallel to the first axis. Each optical element is within production tolerances in physical contact with a neighboring optical element such that a total length of the first row of optical elements parallel to the first axis is given by the number of optical elements multiplied with the diameter L. The first row of optical elements is arranged to receive laser light from the first row of lasers during operation of the first row of lasers. A diameter of the laser light emitted by the lasers along the first axis in a reference plane of the optical elements is given by $\Phi$. The n lasers and m optical elements fulfill the condition $n*p=m*L$ ("pitch match condition") with a deviation smaller than +/−5%, more preferably smaller than +/−2%, and most preferably smaller than +/−1%. The reference plane of the optical elements is defined by a plane comprising the points of an optical element which are illuminated by the cone of the laser light by a laser if the first optical axis is collinear to the second optical axis. The reference plane of the optical elements is therefore parallel to the reference plane and the field-of-view and the plane of the laser array. The reference plane defines a distance d between the light emission surfaces of the lasers and the diffusor.

The condition $n*p=m*L$ has the effect that for a lateral displacement, exactly that part of light that is e.g. lost on the left part of optical element (optical element 1), hits the neighboring optical element m+1 on exactly the same part, if the diffusor is arranged in the distance d to the lasers such that the laser beam illuminates the full optical element, or an integer multiple of optical elements (preferably in both directions).

The diameter $\Phi$ may fulfill in this case a condition $k*\Phi=L$ with k a positive integer. Consequently, laser light that is lost on one side (not hitting optical element 1), comes in on the other side (hitting optical element m+1).

The diameter $\Phi$ may, for example, be given by the aperture (light emitting area) of the respective laser in case of collimated laser light ($\theta=0$) or by the aperture of the respective laser in combination with the distance d and the full divergence angle $\theta$ of the laser according to $\Phi=2*d*\tan(\theta/2)$. This equation can be replaced for small angles $\theta$ by $\Phi=d*\theta$. This equation is valid if the extension of the light emission surfaces of the lasers is small compared to the distance d otherwise the diameter $\Phi$ has to be calculated by the Gaussian beam propagation. Preferably, n and m are not equal, but deviate by an integer number, then the diffusor is less dependent on the full divergence angle of the laser.

The lasers of the first row of lasers and the optical elements may alternatively fulfill the condition $L=\Phi/j+p$ with j a positive or negative integer if each pitch shifts a position of the corresponding laser along the first axis relative to an edge of the corresponding optical element by a distance $\Delta \neq 0$ µm ($k*\Phi \neq L$). The parameter j is a positive integer (j=1, 2, 3 . . . ) for L>p (small beam) and a negative integer (j=−1, −2, −3 . . . ) for L<p (large beam). The so called "repetition condition" $L=\Phi/j+p$ is based on the condition that $\Phi=j*\Delta$ with $\Delta=L-p$ and with a deviation smaller than +/−5%, more preferably smaller than +/−2%, and most preferably smaller than +/−1%.

The optical element diameter L may be between 2 µm and 100 µm, preferably between 4 µm and 70 µm, and most preferably between 6 µm and 50 µm. The optical elements can be scaled in diameter almost arbitrary, if the shape is kept. However, below a certain diameter, diffraction effects will start to dominate, so structures of a diameter of less than 2 µm should be avoided.

The laser emission profile may be circular symmetric around the first optical axis (laser emission profile characterized by only one full divergence angle $\theta$). Circular symmetric emission profiles may simplify design of the diffusor for a two-dimensional array of lasers. The lasers may, for example, be Vertical Cavity Surface Emitting Lasers (VCSELs). The VCSELs are arranged on a common substrate. The common substrate may, for example, be a gallium arsenide growth substrate on which the VCSELs are processed.

The lasers may be bottom emitting VCSELs which are arranged to emit the laser light through the substrate. The diffusor is in this embodiment provided on a surface of the (semiconductor) substrate opposing the side of the substrate on which the VCSELs are provided (e.g. deposited). The diffusor may be provided on a glass wafer which is bonded to the substrate. The diffusor may, for example, be etched in the glass wafer prior or after bonding to the wafer comprising the (semiconductor) substrates of the VCSEL array. The glass wafer may, for example, be glued to the substrates.

The diffusor may, according to an alternative embodiment, be integrated in a semiconductor structure, especially the substrate, of the VCSEL array. The high refractive index of the semiconductor substrate (gallium arsenide n~3.5) enables a relatively flat profile of the optical elements. Furthermore, the full divergence angle within a GaAs substrate is smaller than 3°. The small divergence angle may enable an emission characteristic which is nearly identical with the defined illumination pattern. A planarization layer may be provided after integrating the diffusor in the semiconductor substrate. The emission wavelength of the VCSELs is in this case larger than 900 nm, preferably larger than 950 nm to limit absorption losses within the gallium arsenide substrate.

The lasers may alternatively be top emitting VCSELs which are arranged to emit the laser light in a direction away from the substrate. The diffusor comprises a material provided on top of the side of the substrate on which the VCSELs are provided. The material is transparent in the wavelength range of the laser light (e.g. in the wavelength range between 750 nm-1200 nm). The transparent material may be UV- or blue light curable optical polymer as described below. The transparent material may be provided on top of the mesas of the VCSELs. Alternatively, a planarization layer may be provided in order to provide an essentially plain surface at, for example, the level of the light emitting areas of the single VCSEL. The transparent material of the diffusor may be deposited on top of the planarization layer.

The optical arrangement may further comprise an optical collimation structure arranged between the lasers and the diffusor. The optical collimation structure is arranged to collimate the laser light such that the diffusor transforms the collimated laser light to transformed laser light. Collimation of the laser light by means of an array of optical elements e.g. integrated in the substrate (bottom emitter) or provided on top of the semiconductor layers of the VCSELs may further improve the emission characteristic of the transformed laser light.

According to a second aspect of the present invention, a light emitting device is provided. The light emitting device comprises at least one laser arrangement as described above and an electrical driver for electrically driving the lasers of the laser array. The light emitting device may further comprise a controller for providing control signals for controlling the electrical driver. The controller may, for example, comprise a storage device for storing data and a processing device for executing instructions comprised by the stored data. The stored data may, for example, comprise a sequence of providing an electrical drive current to the lasers or groups of lasers comprised by the laser array.

The laser arrangement or lighting device may be used in consumer devices (e.g. smartphones), vehicles as well as high power industrial applications in order to support:
 consumer and portable applications as gesture interface or 3D scanner in smart-phones, lap-top, tablet, . . .
 user interface or indoor navigation for robotics, sports, industry, lighting, . . .
 high end for automotive mid-range detection (park assist, safe city driving), and
 high power industrial applications.

According to a third aspect of the present invention, a time-of-flight camera is provided. The time-of-flight camera comprises the laser arrangement or light emitting device according to any embodiment described above, a light detector and an evaluator. The evaluator is arranged to determine a distance to the object by means of transformed laser light detected by the light detector.

According to a fourth aspect of the present invention, a method of fabricating a laser arrangement according to any embodiment described above is provided. The method comprises the steps of:
 providing a laser array, wherein the laser array comprises a multitude of lasers arranged in a first regular pattern, wherein each laser is arranged to emit the same laser emission profile around a first optical axis with a divergence angle $\theta/2$ with respect to the first optical axis in at least one direction perpendicular to the first optical axis,
 providing an optical arrangement, wherein the optical arrangement comprises a diffusor, wherein the diffusor comprises an array of optical elements arranged in a second regular pattern, wherein each optical element comprises a second optical axis,
 arranging each optical element to provide a defined illumination pattern along at least one first illumination axis in reference plane in a defined field-of-view if laser light is received within a defined range of angles by each surface element of the respective optical element, wherein the defined range of angles is smaller than or equal to a range of angles between $-\theta$ and $+\theta$, preferably between $-\theta/2$ and $+\theta/2$ with respect to the second optical axis,
 arranging the lasers and the optical elements relative to each other such that the diffusor transforms laser light received from the lasers to transformed light and wherein an emission characteristic of the transformed light along the first illumination axis in the reference plane in the defined field-of-view is characterized by the same characteristics as the defined illumination pattern.

The step of providing the laser array may comprise a step of providing a substrate and the subsequent step of providing a multitude of VCSELs on the substrate. The substrate may be removed after processing the lasers.

The steps need not necessarily be performed in the order given above. The method may comprise steps to manufacture any laser arrangement described above.

The diffusor may be provided by several methods, among them etching, soft-cushion imprint lithography followed by etching, UV-replication of a master structure on a wafer followed by an etch-transfer of the replicated structure in the semiconductor substrate and the like. Furthermore, wafer bonding of e.g. a glass wafer comprising a multitude of diffusors to, for example, a semiconductor wafer comprising a multitude of substrates may be used. Alternatively, a curable polymer may be provided and subsequently processed by means of processing light (e.g. UV or blue light). Details of such a process are described, for example, on page 2, line 2 to page 5, line 19 of WO 2017/055160 A1. Furthermore, FIGS. 2-10 and the corresponding description on page 9, line 20 to page 11, line 20 provides a special example of such a process. The disclosure of WO 2017/055160 A1 is incorporated by reference.

The diffusor may be covered by a planarization layer. The planarization layer is characterized by a lower refractive index than a material of the diffusor. The diffusor may be designed with respect to the refractive index of the planarization layer in order to provide the desired illumination pattern. The planarization layer may be used to smooth the surface irregularities caused by the diffusor. The planarization layer may comprise materials like silicone, epoxy, polyimide, SiN and the like. The difference between the refractive index of the diffusor and the refractive index of the planarization layer has to be sufficient to provide the illumination pattern for a multitude of applications. The planarization layer may protect the diffusor and may simplify further processing steps.

Further advantageous embodiments are defined below.

In the Figures, like numbers refer to like objects throughout. Objects in the Figures are not necessarily drawn to scale.

Various embodiments of the invention will now be described by means of the Figures.

Figure 2:
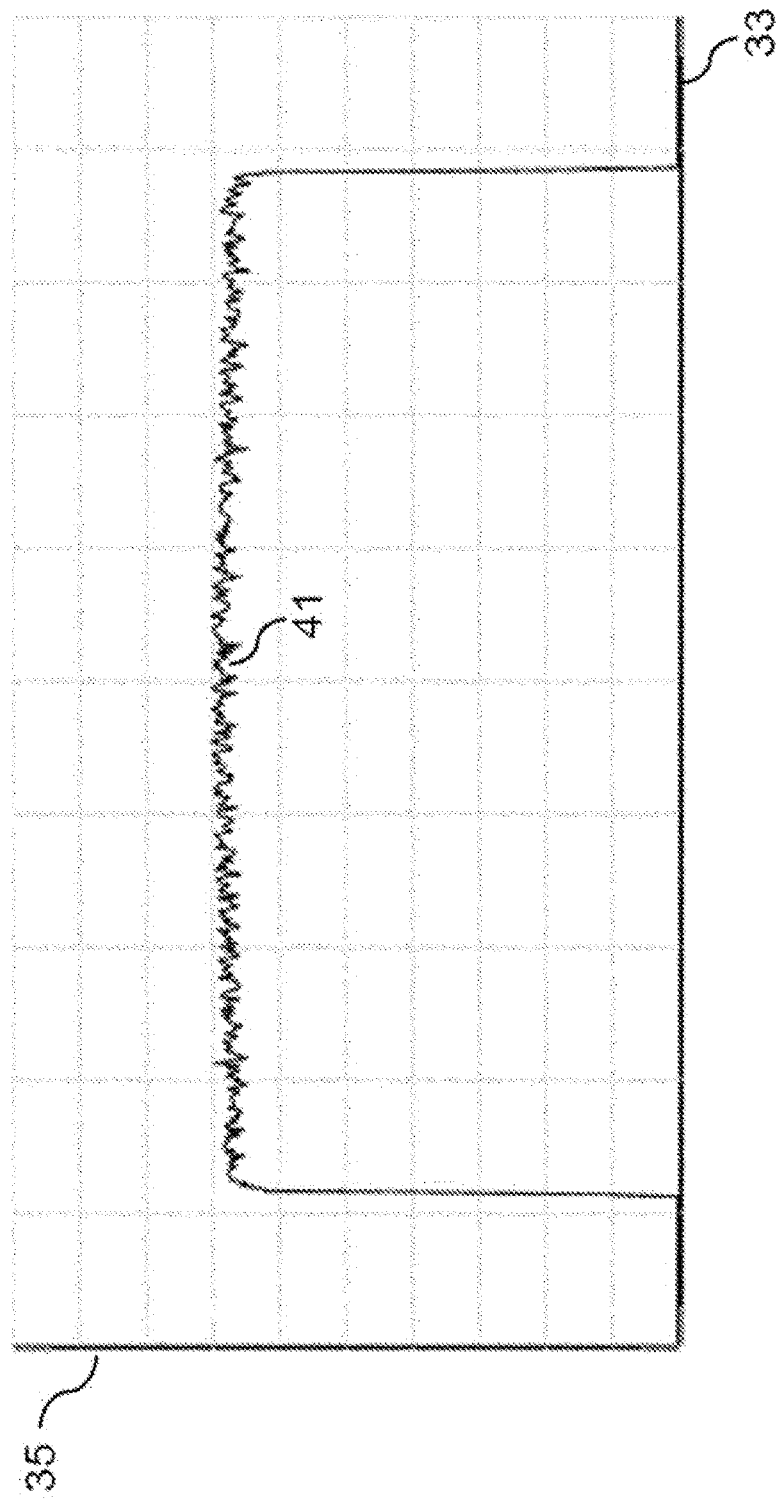
FIG. 2 shows the irradiance of the optical element shown in FIG. 1.
Figure 3:
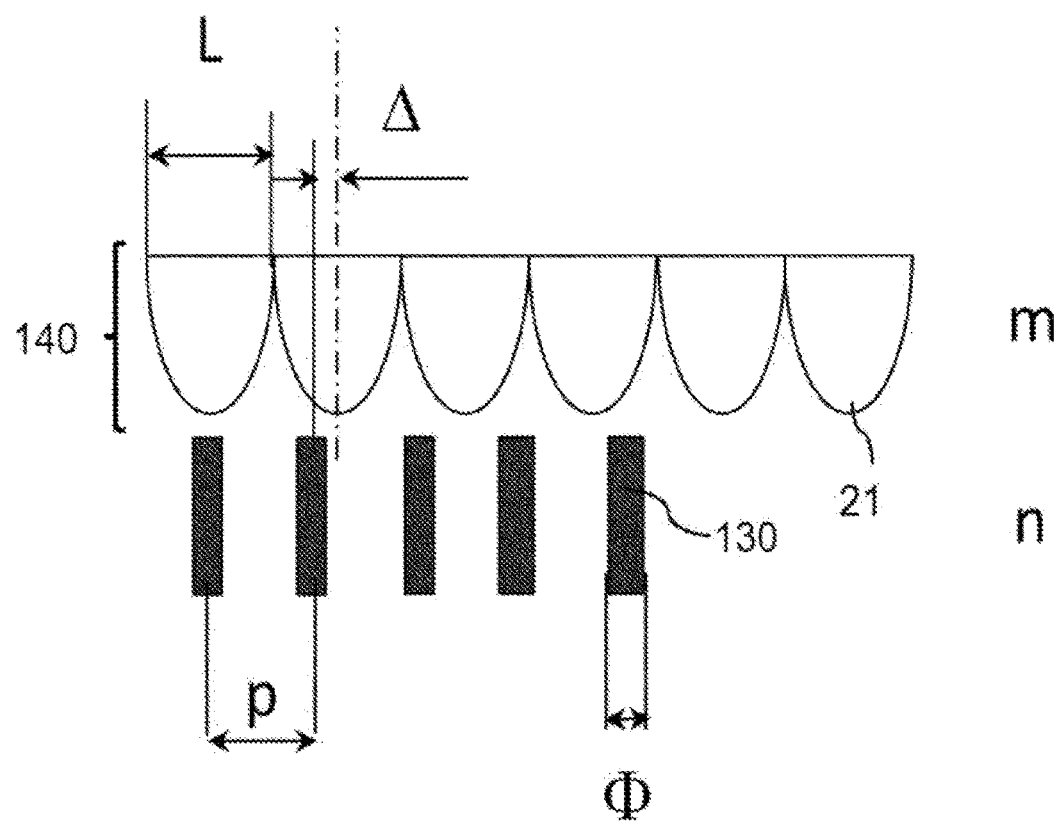
FIG. 3 shows a principal sketch of a first laser arrangement.

FIG. 1 shows a principal sketch of an optical element 21, which is comprised by a diffusor (see, e.g., diffusor 140 in FIG. 3 comprising optical elements 21). The diameter L of the optical element is 0.042 mm. The cylindrical optical element 21 is arranged to transform collimated laser light 10 to transformed light 150. The cylindrical optical element 21 is especially optimized to generate an angular distribution with a FWHM of 128□. FIG. 2 shows the corresponding the irradiance 41 of the optical element shown in FIG. 1. The spatial distribution (irradiance) on the reference plane 160 in the field-of-view is optimized such that the intensity 35 is flat for a parallel or collimated laser beam along a first illumination axis 33. This optical element 21 or a scaled version (changing the optical element diameter L but keeping the shape) is optimized for collimated laser light 10 and may be used in the diffusors 140 of all laser arrangements 100 to transform the laser light 10 to transformed laser light 150 such that that the emission characteristic of the transformed light 150 (see, for example, FIG. 6, irradiance 42) along the first illumination axis 33 in the reference plane in the defined field-of-view 160 is characterized by the same characteristics as the irradiance 41 of the single optical element 21. The optical element 21 optimized for collimated laser light 10 may in case of laser light 10 with a laser emission profile characterized by a full divergence angle □≠0 cause a slight spread of the emission characteristic. The optical element 21 may therefore be slightly adapted to the range of angles which are received by the surface elements of one optical element 21. The design of the optical element 21 may especially be adapted in the outer region which receives laser light under the largest angles in a parallel arrangement of the first and the second optical axis. The latter may especially useful in which an optimization, for example, with respect to collimated laser light may cause total internal reflection (e.g. optical element comprised substrate with high refractive index) which may cause high optical losses.

Figure 6:
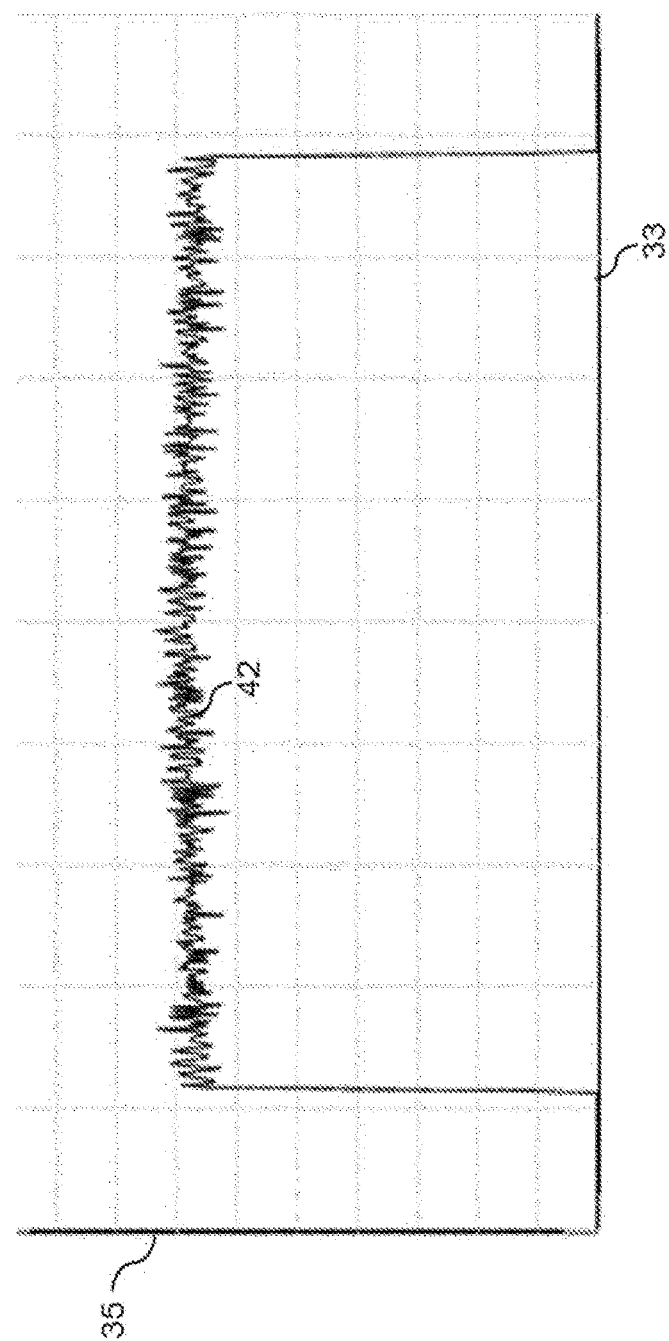
FIG. 6 shows the irradiance of the third laser arrangement.

The single optical element 21 may be adapted to provide in comparison to the example given in FIG. 6 a different illumination pattern (e.g. somewhat increased intensity at the rim of the illumination pattern). This differently shaped optical element 21 may then be used in all laser arrangement 100, which should provide transformed light 150, which is characterized by essentially the same characteristics (e.g. somewhat increased intensity at the rim of the field-of-view) as the defined illumination pattern of the optical element 21.

FIG. 3 shows a principal sketch of a first laser arrangement comprising an array of lasers 130 and a diffusor 140 comprising an array of optical elements 21. The first laser arrangement is shown to explain the so-called pitch match condition. The first laser arrangement comprises a two-dimensional laser array arranged in the XY plane perpendicular to the plane of FIG. 3. The first laser arrangement is arranged such that in both directions X and Y, the following condition has to be fulfilled by the chosen design:

$$n*p=m*L,\qquad(1)$$

where p is the pitch between the lasers 130 and n the number of lasers 130 in this direction, while L is the size of the optical element diameter or pitch. In the present case the optical element pitch is equal to the optical element aperture. The number of optical elements 21 is denoted by m. In other words, if the laser array has the size X=n_x*p_x, then the optical element diameter L and number should be selected such that an integer number of optical elements 21 has substantially the same length L_X (+/−5%, preferably +/−2%, more preferably +/−1%). The same condition should be fulfilled for the other dimension Y, but number and pitch of the lasers 130 may be different. L_Y is determined by the horizontal to vertical aspect ratio of the desired beam profile after L_X is fixed. Preferably, n and m are not equal, but deviate by an integer number, then the diffusor 140 is less dependent on the full divergence angle of the laser 130. Φ is a diameter of the laser light 10 or beam size emitted by the lasers 130. The lasers 130 emit in this embodiment parallel laser beams (collimated laser light). The diameter Φ is therefore identical with a lateral extension of a light emission surface of the laser 130.

Figure 4:
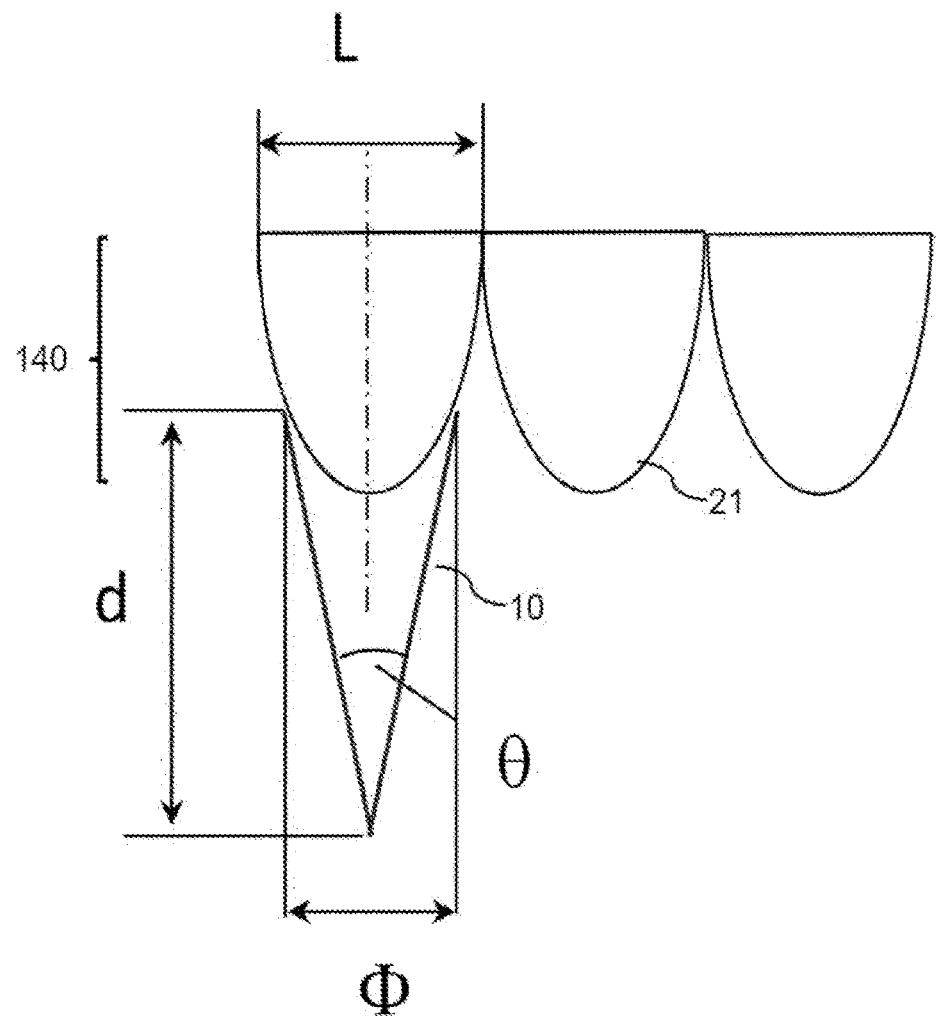
FIG. 4 shows a principal sketch of a segment of a second laser arrangement.

FIG. 4 shows a principal sketch of a segment of a second laser arrangement in which the lasers (e.g. VCSELs) emit laser light with a full divergence angle θ. the beam size or diameter Φ in a distance d at a reference plane of the optical elements 21 is approximately given by Φ=d*θ. The reference plane of the optical elements 21 or more specifically the laser array is defined by the points of the laser 130 at which the emission cone of the emitted laser light in the symmetric arrangement (optical axis of laser 130 aligned with optical axis of optical element 21) depicted in FIG. 4 enters the optical elements.

The condition n*p=m*L is sufficient if the diffusor 140 is arranged in a distance d to the laser, that the laser beam illuminates the full optical element, or an integer multiple of optical elements (in both directions), Φ=k*L (+/−5%, preferably +/−2%, more preferably +/−1%) with k a positive integer. If the latter condition is not fulfilled the so-called "repetition condition" has to be fulfilled in addition to the pitch match condition. Each laser pitch shifts the position of the laser relative to the edge of the optical element by the so-called sample pitch Δ (see FIG. 3).

$$\Delta=L-p\qquad(2)$$

Suppose that after n lasers, the position of the laser relative to the edge of the optical element is the same. That means the position is shifted over a distance equal to the absolute value of (n−m) times the optical element diameter.

$$n\cdot\Delta=L(n-m)\qquad(3),$$

optical element. After this condition is reached the pattern repeats.

If the beam diameter Φ is such that it is, for instance, slightly larger than the sample pitch Δ, then the filling is full but not uniform (Φ≠k*L). One will have areas where the light is one level and in the overlap areas it is double. This will give a uniform background with spikes on top. The emission characteristic of the transformed light would. in this case. be different than the characteristics of the defined illumination pattern shown, for example, in FIG. 2.

To get a uniform filling the beam diameter Φ needs to be such that the beam diameter Φ is equal to an integral integer number j of sample pitches Δ (+/−5%, preferably +/−2%, more preferably +/−1%):

$$\Phi=j\cdot\qquad(4),$$

j is a positive integer (=1, 2, 3 . . . ) for L>p (small beam) and a negative integer (j=−1, −2, −3 . . . ) for L<p (large beam). The value of j may depend on the number n of lasers and the number m of optical elements and especially on the difference between n and m.

The beam diameter Φ is fixed, because it is determined by the beam divergence angle and the minimum mounting distance between the optical element array and the VCSEL array. Furthermore, p and n are fixed as discussed above. So Φ, p and n are known and fixed. For the optical element diameter L holds by using (2) and (4) resulting in the "repetition condition":

$$L=\frac{\Phi}{j}+p\qquad(5)$$

In general, the higher the numbers m and j can be, the more easy and reliable it is to achieve a homogenous intensity profile under arbitrary lateral alignment and tolerances on distance d and laser divergence θ.

It is possible to have a non-rectangular arrangement of lasers 130 and optical elements 21 as long as both conditions are fulfilled.

It is also possible to vary the parameters in different sub arrays, as long as the conditions are fulfilled in each sub-array. This can be interesting if radial profiles with an intensity increase towards large angles are desirable.

Furthermore, the optical element 21 shown in FIG. 1 can optionally be substituted by two lenses (free-form optic)

with a smaller sag, one having a very high conic constant (such that it is almost axicon like), while the other can be flatter. The total extension of the free-form optic defines in this case the diameter L.

Examples of the conditions of this invention by means of optical simulations are shown and discussed with respect to FIGS. 5-10. The simulations are performed by the ray tracing program Zemax.

Figure 5:
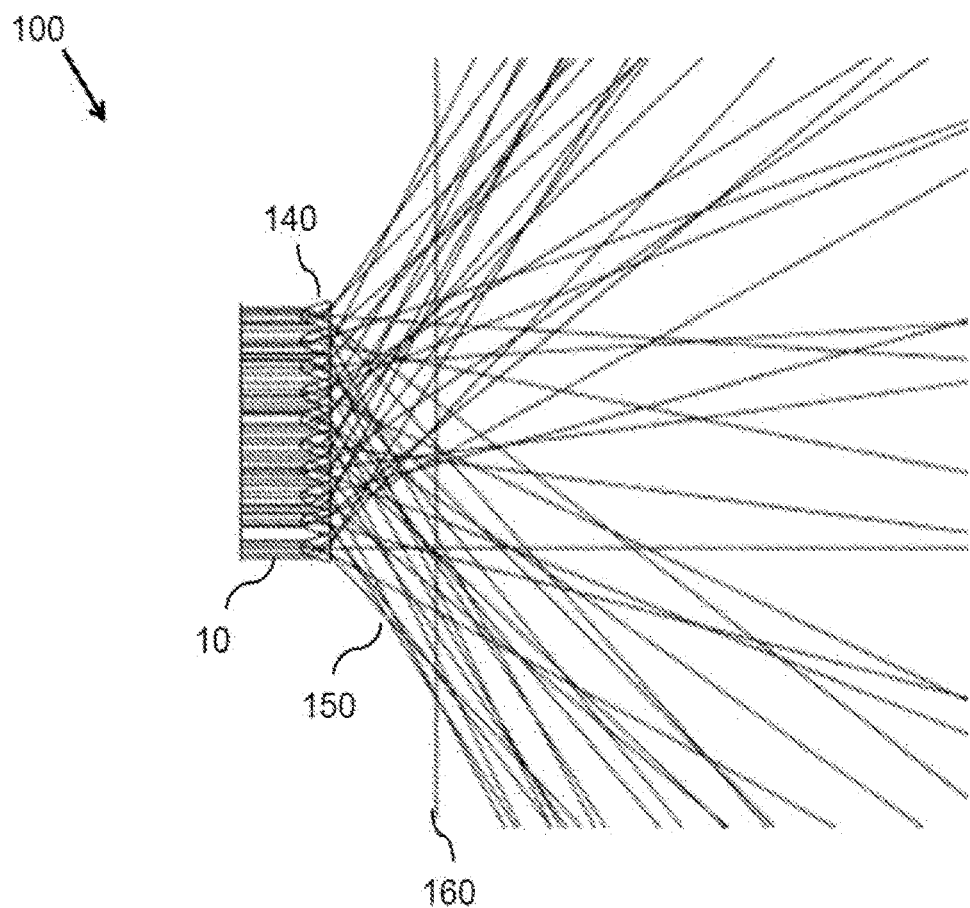
FIG. 5 shows a principal sketch of a third laser arrangement.

FIG. 5 shows a principal sketch of a third laser arrangement 100. With reference to FIGS. 3 and 4, the lasers 130 comprised by the laser array are characterized by pitch p=0.04 mm, a diameter of the laser beam at the reference plane of the diffusor 140 of Φ=0.04 mm and n=10 lasers 130. The diffusor 140 comprises m=10 optical elements 21 with an optical element diameter L=0.04 mm. The pitch match condition n*p=m*L=0.4 mm is fulfilled. The sample pitch is Δ=0. The beam diameter is Φ=L=0.04 mm such that the repetition condition needs not to be fulfilled. Each optical element 21 is characterized by the optimized shape discussed with respect to FIG. 1 and FIG. 2. There is no lateral offset between the lasers 130 and the diffusor 140. FIG. 6 shows the irradiance of the third laser arrangement 100. The spatial distribution (irradiance) 42 on the reference plane in the field-of-view 160 is as discussed with respect to FIG. 2 such that the intensity 35 is flat for a parallel or collimated laser beam along a first illumination axis 33 in the field of view. The irradiance 42 of the third laser arrangement 100 is obviously characterized by the same characteristics (flat-top profile) as the irradiance 41 of the single optical element 21 discussed with respect to FIGS. 1 and 2.

Figure 7:
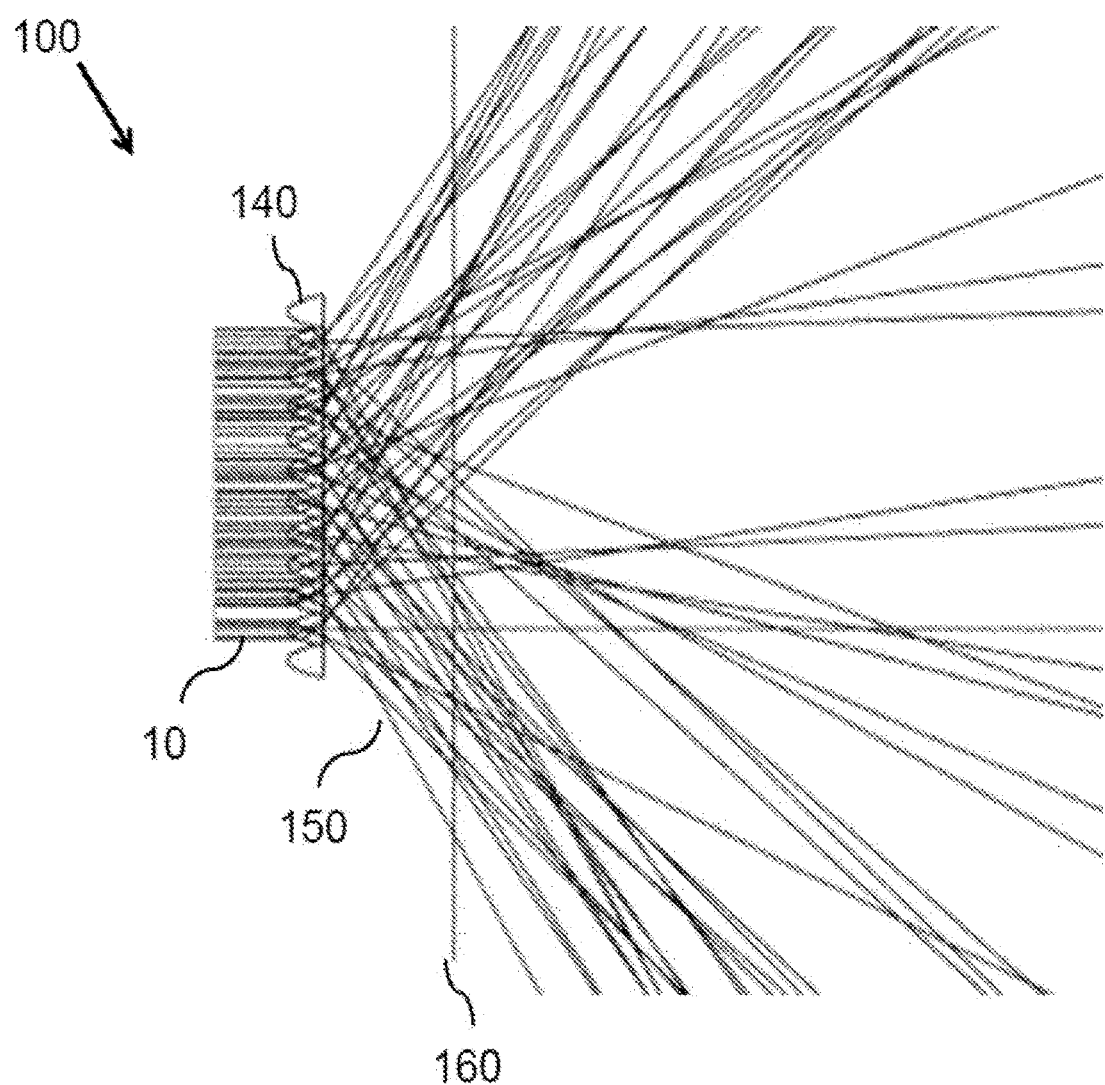
FIG. 7 shows a principal sketch of a fourth laser arrangement.

FIG. 7 shows a principal sketch of a fourth laser arrangement 100. With reference to FIGS. 3 and 4, the lasers 130 comprised by the laser array are characterized by pitch p=0.03636 mm, a diameter of the laser beam at the reference plane of the diffusor 140 of Φ=0.03636 mm and n=11 lasers 130. The diffusor 140 comprises m=10 optical elements 21 with an optical element diameter L=0.04 mm. The pitch match condition n*p=m*L=0.4 mm is fulfilled. The sample pitch is Δ=0.00364. The parameter j is 10 such that the repetition condition is fulfilled. The beam diameter Φ is smaller than the optical element diameter L such that j is a positive integer. Each optical element 21 is characterized by the optimized shape discussed with respect to FIG. 1 and FIG. 2. The laser array and the diffusor are laterally shifted with respect to each other by 0.002 mm. The pitch match condition n*p=m*L=0.4 mm and the repetition condition are fulfilled such that the irradiance is essentially the same as discussed with respect to FIG. 6.

Figure 8:
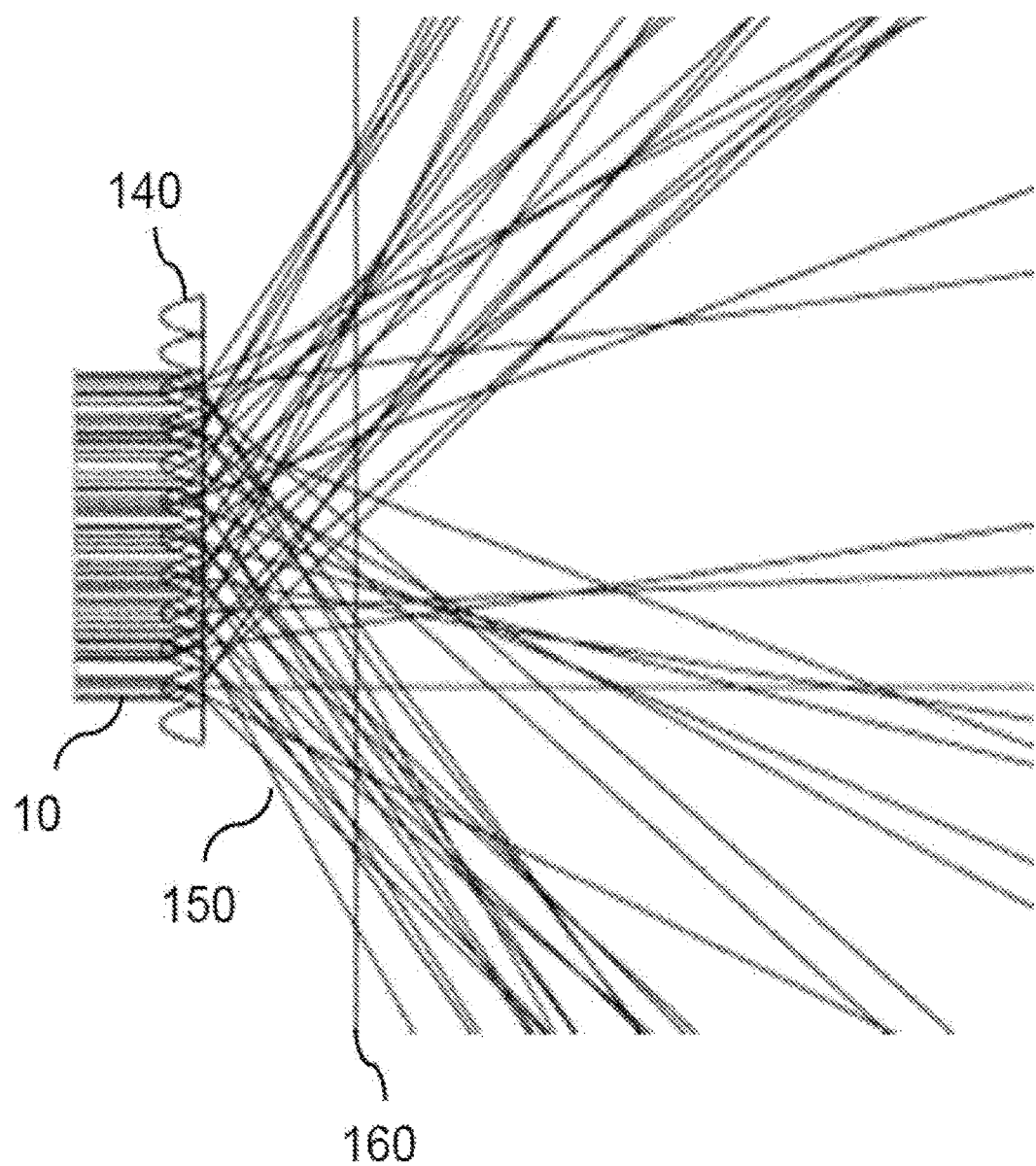
FIG. 8 shows a principal sketch of a fifth laser arrangement which is not in accordance with the present invention.
Figure 9:
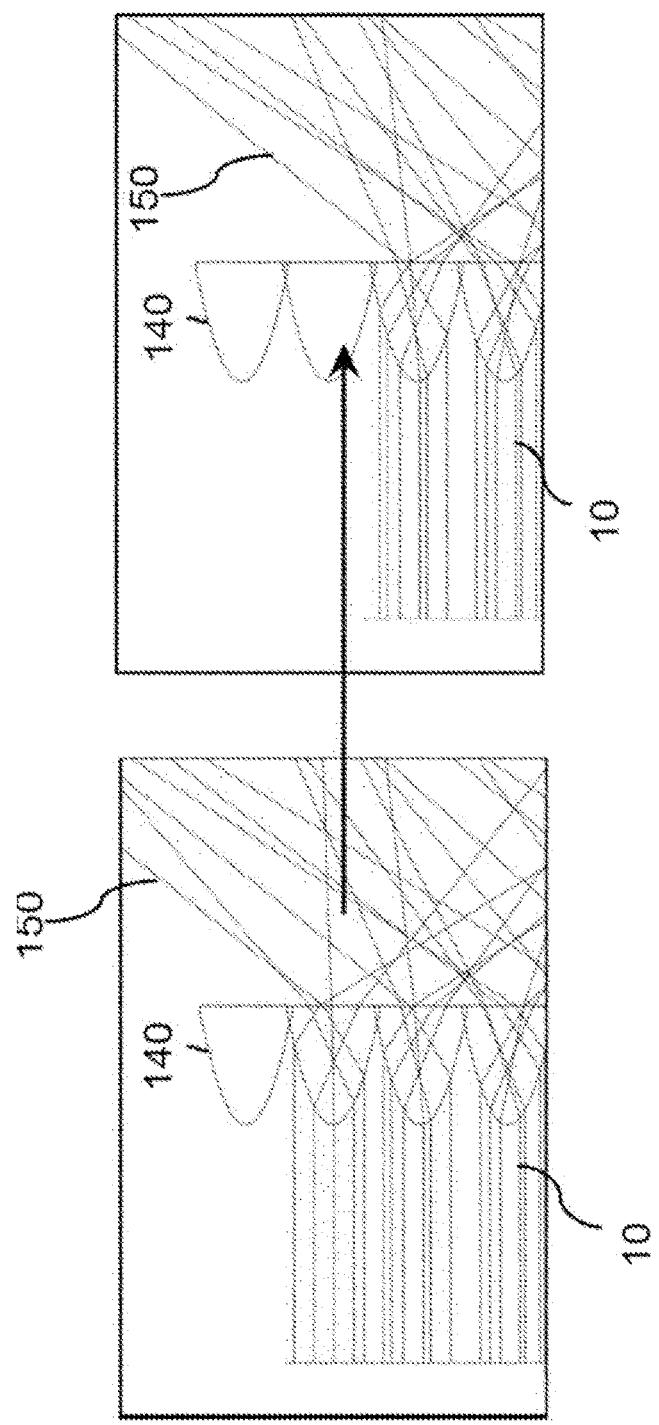
FIG. 9 shows a comparison between the fourth laser arrangement and the fifth laser arrangement.
Figure 10:
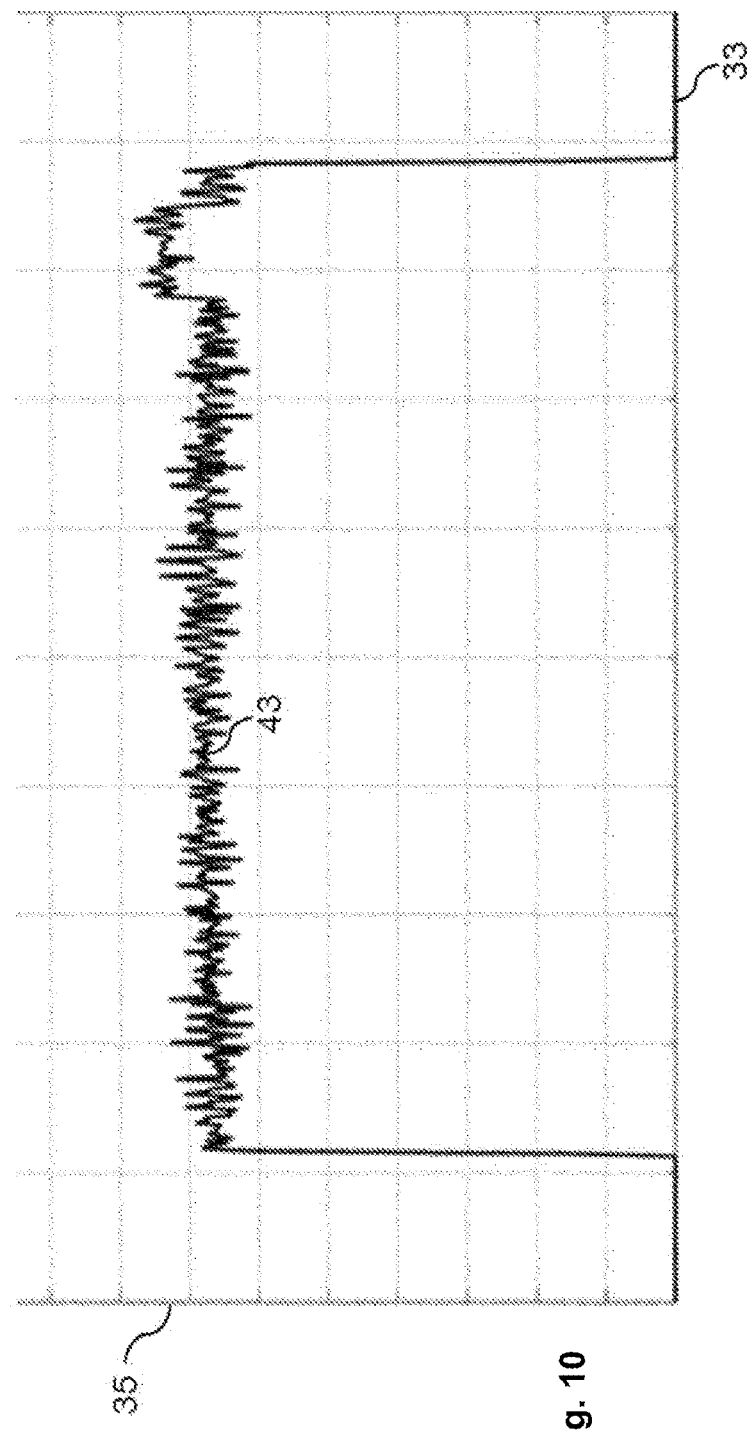
FIG. 10 shows the irradiance of the fifth laser arrangement.

FIG. 8 shows a principal sketch of a fifth laser arrangement which is not in accordance with the present invention. With reference to FIGS. 3 and 4, the lasers 130 comprised by the laser array are characterized by pitch p=0.03636 mm, a diameter of the laser beam at the reference plane of the diffusor 140 of Φ=0.03636 mm and n=10 lasers 130. The diffusor 140 comprises m=10 optical elements 21 with an optical element diameter L=0.04 mm. The sample pitch is Δ=0.00364. The parameter j is 10 such that the repetition condition is fulfilled. The beam diameter Φ is smaller than the optical element diameter L such that j is a positive integer. Each optical element 21 is characterized by the optimized shape discussed with respect to FIG. 1 and FIG. 2. The laser array and the diffusor are laterally shifted with respect to each other by −0.003 mm. FIG. 9 shows a comparison between the fourth laser arrangement 100 and the fifth laser arrangement. The laser array comprised by the fifth laser arrangement comprises one laser 130 less as the laser array comprised by the fourth laser arrangement 100 such that the pitch match condition n*p=m*L is not fulfilled but the repetition condition is fulfilled. The characteristic of the irradiance 43 shown in FIG. 10 therefore differs from the irradiance of the single optical element 21 shown in FIG. 2. The irradiance 43 shows an increased intensity 35 on the right side is and is therefore disturbed. It can be shown by means of further simulations that the irradiance is disturbed as soon as one of the conditions is not fulfilled. The kind of disturbance depends on which one of the conditions is not fulfilled and, for example, the relation between the optical element diameter and the beam diameter (smaller or bigger).

Figure 11:
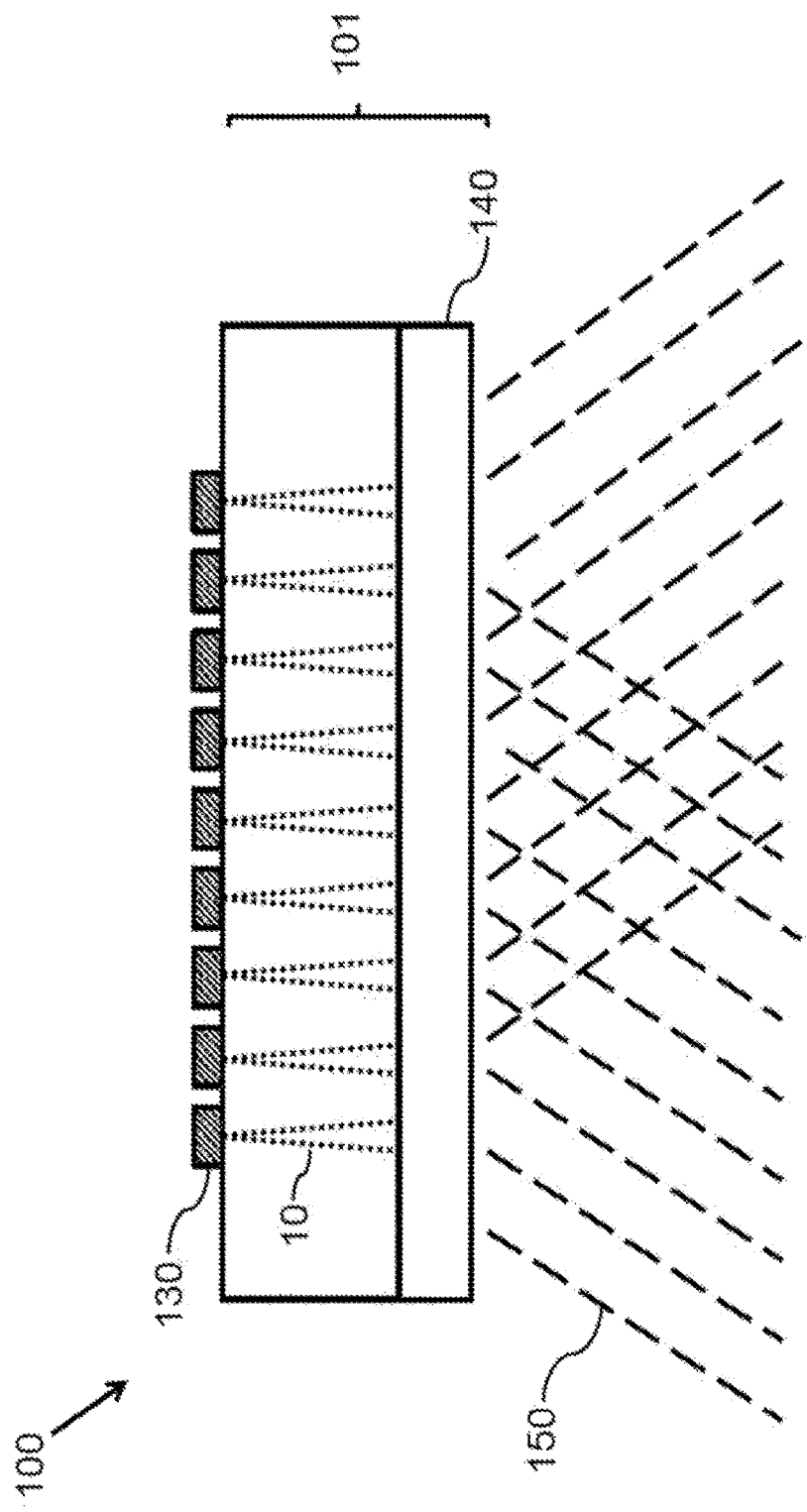
FIG. 11 shows a principal sketch of a sixth laser arrangement.

FIG. 11 shows a principal sketch of a sixth laser arrangement 100. The cross-section shows an example with nine VCSELs. The VCSELs emit laser light 10 through the semiconductor substrate 101 (bottom emitter). The diffusor 140 is characterized by one surface of the semiconductor substrate 101. The high refractive index of the GaAs semiconductor substrate 101 of n=3.5 enables a rather low-profile of the optical elements 21 comprised by the diffusor 140.

Figure 12:
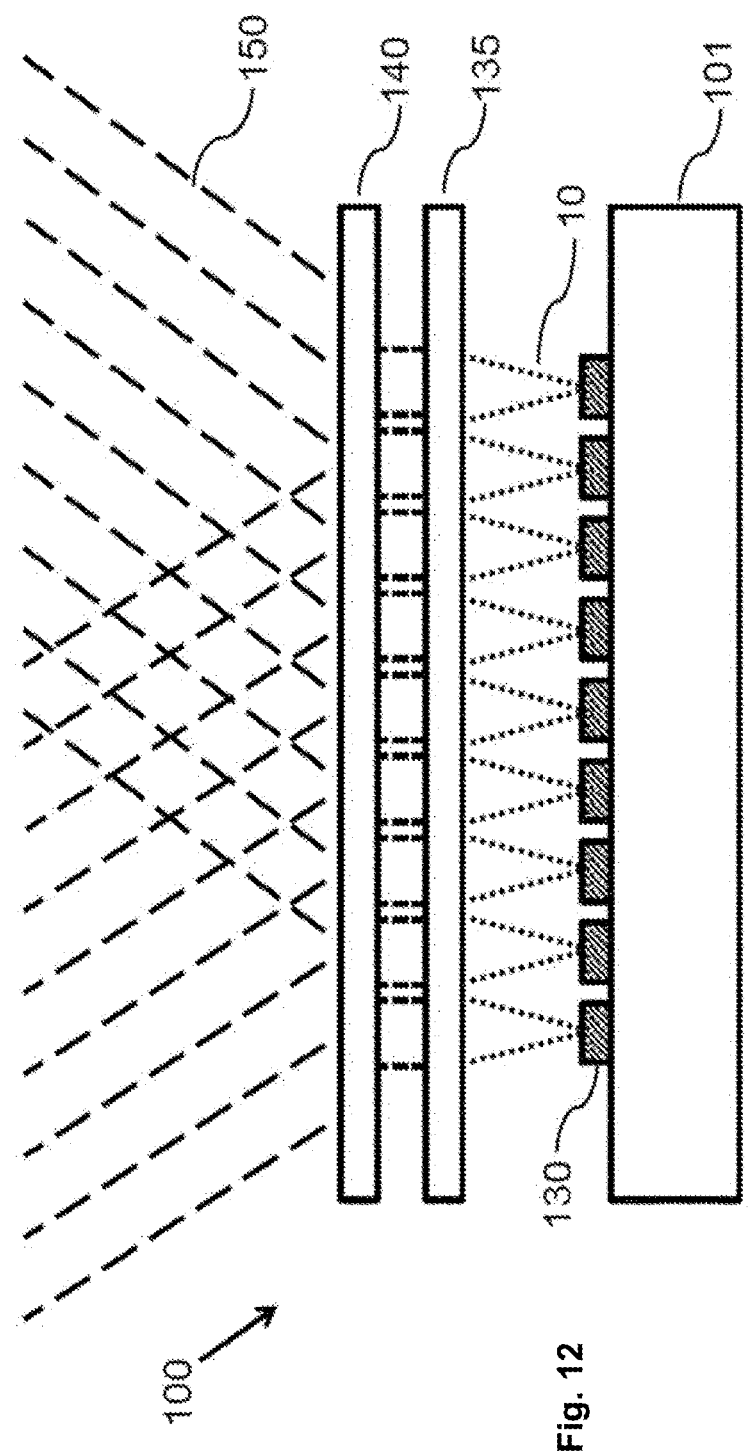
FIG. 12 shows a principal sketch of a seventh laser arrangement.

FIG. 12 shows a principal sketch of a seventh laser arrangement 100. The cross-section is taken across a line of VCSELs of the VCSEL array comprised by the laser arrangement 100. Nine mesas of top emitting VCSELs provided on top of a semiconductor substrate 101 are shown. Each VCSEL emits laser light 10 with a full divergence angle of around 20 in air. An optical collimation structure 135 is arranged between the lasers 130 and a diffusor 140 similar as described, for example, with respect to FIG. 5. The optical collimation structure 135 comprises an array of microlenses which is arranged to collimate the laser light 10 such that the diffusor 140 receives collimated laser light. The diffusor 140 transforms the collimated laser light such that an essentially perfect flat top profile as discussed with respect to FIG. 6 is provided along the first illumination axis 33 in the reference plane in the field-of-view 160.

Figure 13:
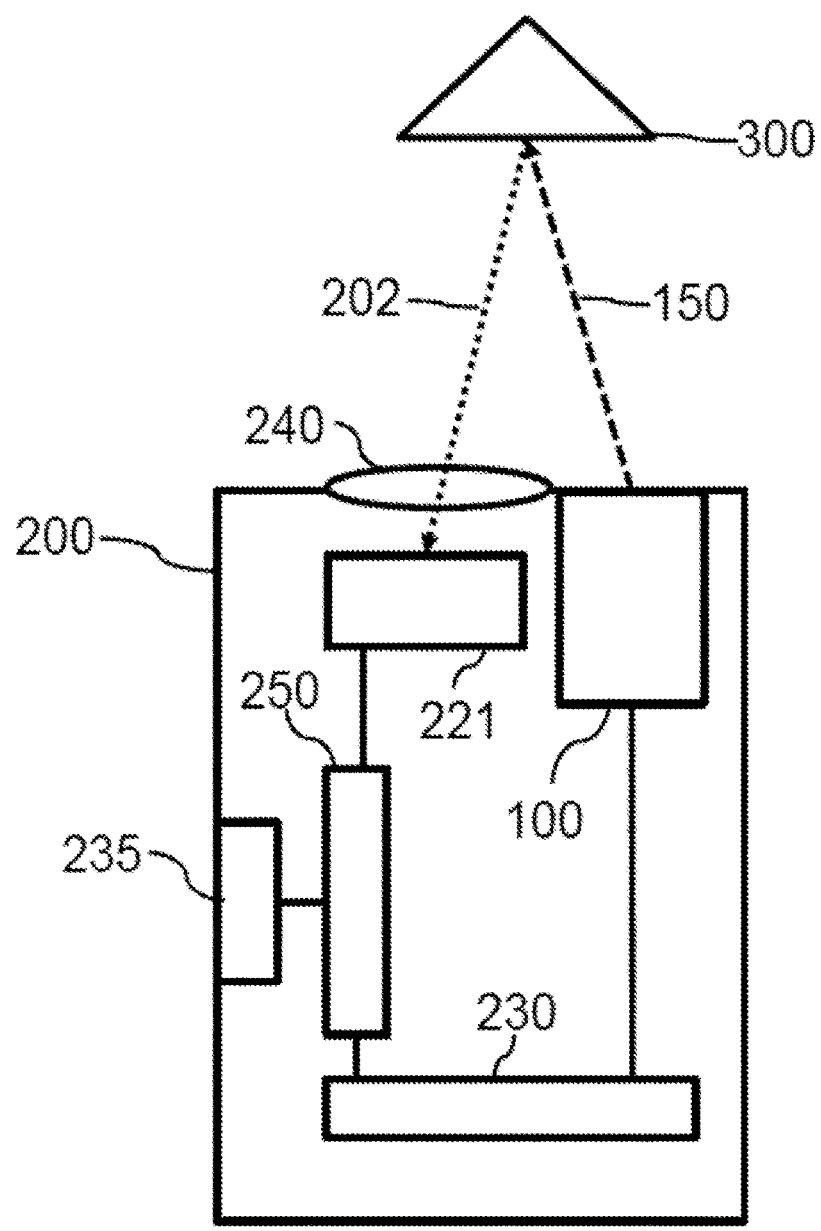
FIG. 13 shows a principal sketch of a time-of-flight camera.

FIG. 13 shows a principal sketch of a time-of-flight camera 200. The time-of-flight camera 200 comprises a laser arrangement 100 in accordance with one of the embodiments discussed above. The time-of-flight camera 200 further comprises a detector 221 which is arranged to detect very short light pulses. Such short laser pulses may be caused by transformed laser light 150 emitted by a laser or VCSEL array comprised by the laser arrangement 100 hitting an object 300. A part of the transformed laser light 150 is reflected by the object 300 such that reflected laser light 202 is received by optical device 240 (e.g. optical element or optical element arrangement) which images or focuses the received laser light to detector 221. The reflected laser light 202 causes a corresponding electrical signal in the detector 221. An electrical driver 230 may be arranged to electrically drive the VCSEL array or optionally each VCSEL or sub-groups of VCSELs of the laser arrangement 100 separately. A controller 250 is connected to the electrical driver 230 in order to control, for example, start and stop time of the laser pulses emitted by VCSEL array. The controller 250 is further connected with the detector 221 in order to receive the electrical signal caused by the reflected laser light 202 detected by detector 221. The time-of-flight camera 200 further comprises an optional interface 235 to transfer start and stop time of the transformed laser light 150 emitted by the corresponding VCSEL or group of VCSELs as well as time of reception of the electrical signal caused by the reflected laser light 202. The transferred data can be used to calculate the time-of-flight of the laser light and therefore a distance between the time-of-flight camera 200 and the object 300. The time-of-flight camera 200 may alternatively comprise an evaluator (not shown) electrically connected with the controller 250 (or may comprise or be comprised by controller 250) in order to determine the distance to the object. Several distance measurements may be used to determine a velocity or even an acceleration of the object 300. The illumination pattern provided by means of the laser arrangement 100 may be adapted to the optical device 240. The intensity may, for example, increase at the rim of the illumination pattern in order to compensate for optical losses of the optical device 240.

Figure 14:
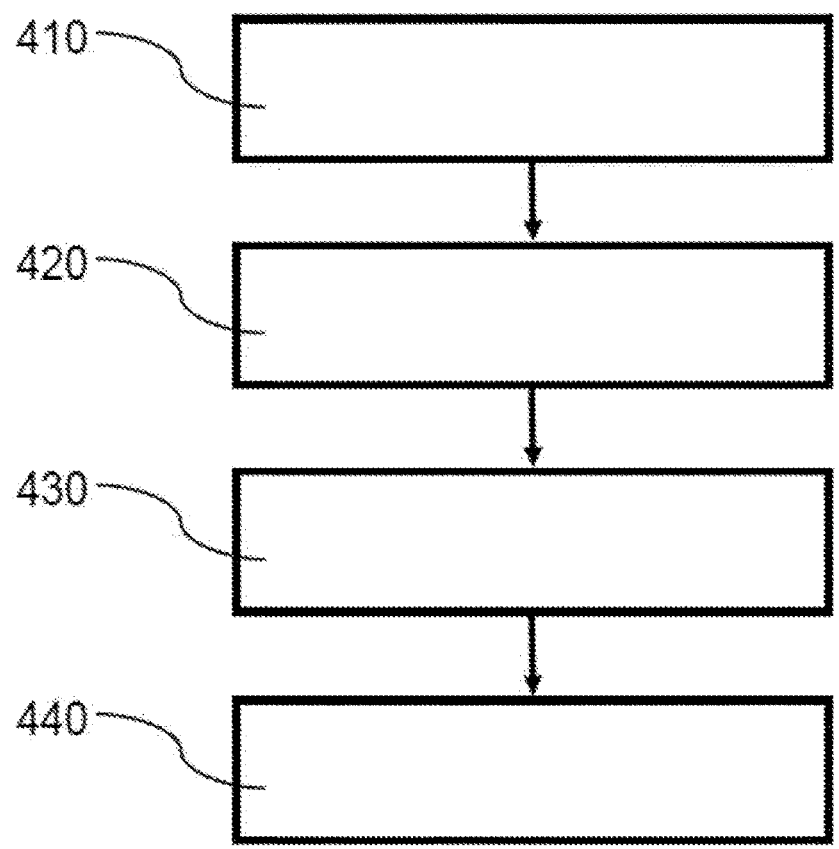
FIG. 14 shows a principal sketch of a method of fabricating a laser arrangement.

FIG. 14 shows a principal sketch of a method of fabricating a laser arrangement 100. A laser array 110 is provided in step 410. The laser array comprises a multitude of lasers 130 arranged in a first regular pattern. Each laser 130 is arranged to emit the same laser emission profile around a first optical axis with a divergence angle θ/2 with respect to the first optical axis in at least one direction perpendicular to the first optical axis. An optical arrangement comprising a diffusor 140 is provided in step 420. The diffusor 140 comprises an array of optical elements 21 arranged in a second regular pattern. Each optical element 21 comprises a second optical axis. The diffusor is arranged in step 430 such that each optical element 21 provides a defined illumination pattern along at least one first illumination axis in a reference plane in a defined field-of-view if laser light 10 is received within a defined range of angles by each surface element of the respective optical element 21, wherein the defined range of angles is smaller than or equal to a range of angles between −θ and +θ, preferably between −θ/2 and +θ/2 with respect to the second optical axis. The laser array and/or the diffusor is arranged in step 440 such that the lasers 130 and the optical elements 21 are positioned relative to each other such that the diffusor 140 transforms laser light 10 received from the lasers 130 to transformed light 150. An emission characteristic of the transformed light 150 along the first illumination axis in the reference plane in the defined field-of-view is characterized by the same characteristics as the defined illumination pattern.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 laser light
21 optical element
33 first illumination axis (arbitrary units)
35 intensity (arbitrary units)
41 irradiance (spatial distribution) of single optical element
42 irradiance (spatial distribution) of laser arrangement
43 distorted irradiance
100 laser arrangement
101 substrate
130 laser
135 optical collimation structure
140 diffusor
150 transformed laser light
200 time of flight camera
202 reflected laser light
221 light detector
230 electrical driver
235 interface
240 optical device
250 controller
300 object
410 step of providing laser array
420 step of providing optical arrangement
430 step of arranging diffusor
440 step of arranging laser array
p laser pitch
L optical element diameter
Φ diameter of laser cone
d distance between lasers and diffusor
Δ sample pitch

The invention claimed is:

1. A laser arrangement comprising:
a laser array; and
an optical arrangement,
wherein the laser array comprises a multitude of lasers arranged in a first regular pattern,
wherein each laser, of the lasers, is arranged to emit a same laser emission profile around a first optical axis with a divergence angle θ/2 with respect to the first optical axis in at least one direction perpendicular to the first optical axis, wherein the optical arrangement comprises a diffusor, wherein the diffusor comprises an array of optical elements, which are arranged in a second regular pattern, wherein each of the optical elements comprises a second optical axis, wherein each of the optical elements is arranged to provide a defined illumination pattern along at least one first illumination axis in a reference plane in a defined field-of-view in a condition where laser light is received within a defined range of angles by each surface element of the respective optical element, of the optical elements, wherein the defined range of angles is smaller than or equal to a range of angles between $-\theta$ and $+\theta$ with respect to the second optical axis, wherein the lasers and the optical elements are arranged relative to each other such that the diffusor transforms the laser light received from the lasers to transformed light, wherein an emission characteristic of the transformed light along the first illumination axis in the reference plane in the defined field-of-view is characterized by the same characteristics as the defined illumination pattern, wherein at least one first row of lasers comprising at least n lasers, of the lasers, is arranged along a first axis parallel to the first illumination axis with a laser pitch p, wherein at least one first row of optical elements comprising at least m optical elements, of the optical elements, is arranged parallel to the first axis, wherein each of the optical elements is characterized by a diameter L parallel to the first axis, wherein each of the optical elements is in physical contact with a neighboring optical element, of the optical elements, such that a total length of the first row of optical elements parallel to the first axis is given by a number of optical elements multiplied with the diameter L, wherein the first row of optical elements is arranged to receive the laser light from the first row of lasers during operation of the first row of lasers, wherein a diameter of the laser light emitted by the lasers along the first axis in a reference plane of the optical elements is given by $\Phi$, wherein the n lasers and the m optical elements fulfill a pitch match condition where n*p is within a deviation smaller than +/−5% of m*L, and wherein n and m are not equal and deviate by an integer number.

2. The laser arrangement according to claim 1, wherein the emission characteristic of the transformed light is invariant with respect to a lateral shift between the lasers and the optical elements, and wherein the lateral shift is parallel to the first illumination axis.

3. The laser arrangement according to claim 1, wherein a distance between a light emission surface of the lasers and a surface of the optical elements opposing a side of the optical elements receiving the laser light is smaller than 300 μm.

4. The laser arrangement according to claim 3, wherein the distance between the light emission surface of the lasers and the surface of the optical elements opposing the side of the optical elements receiving the laser light is smaller than 100 μm.

5. The laser arrangement according to claim 1, wherein the n lasers and the m optical elements fulfill the pitch match condition where n*p is within a deviation smaller than +/−2% of m*L.

6. The laser arrangement according to claim 5, wherein the n lasers and m optical elements fulfill the pitch match condition where n*p is within a deviation smaller than +/−1% of m*L.

7. The laser arrangement according to claim 1, wherein the lasers of the first row of lasers and the optical elements of the first row of optical elements fulfill a condition where k*$\Phi$ is within a deviation smaller than +/−5% of L, where k is a positive integer.

8. The laser arrangement according to claim 7, wherein the lasers of the first row of lasers and the optical elements of the first row of optical elements fulfill the condition where k*$\Phi$ is within a deviation smaller than +/−1% of L.

9. The laser arrangement according to claim 1, wherein the lasers of the first row of lasers and the optical elements of the first row of optical elements fulfill a condition where L is within a deviation smaller than +/−5% of $\Phi/j+p$, with j a positive or negative integer, in a condition where each pitch shifts a position of the corresponding laser along the first axis relative to an edge of the corresponding optical element by a distance $\Delta \neq 0$ μm.

10. The laser arrangement according to claim 9, wherein the lasers of the first row of lasers and the optical elements of the first row of optical elements fulfill the condition where L is within the deviation smaller than +/−1% of $\Phi/j+p$, in the condition where each pitch shifts the position of the corresponding laser along the first axis relative to the edge of the corresponding optical element by the distance $\Delta \neq 0$ μm.

11. The laser arrangement according to claim 1, wherein the laser emission profile is circular symmetric around the first optical axis.

12. The laser arrangement according to claim 11, wherein the lasers are vertical cavity surface emitting lasers, wherein the vertical cavity surface emitting lasers are arranged on a common substrate.

13. The laser arrangement according to claim 12, wherein the vertical cavity surface emitting lasers are bottom emitting vertical cavity surface emitting lasers which are arranged to emit the laser light through the common substrate, and wherein the diffusor is provided on a surface of the common substrate opposing the side of the substrate on which the vertical cavity surface emitting lasers are provided.

14. The laser arrangement according to claim 13, wherein the diffusor is integrated in the common substrate.

15. The laser arrangement according to claim 12, wherein the vertical cavity surface emitting lasers are top emitting vertical cavity surface emitting lasers which are arranged to emit the laser light in a direction away from the common substrate, wherein the diffusor comprises a material provided on top of a side of the substrate on which the vertical cavity surface emitting lasers are provided, and wherein the material is transparent in a wavelength range of the laser light.

16. The laser arrangement according to claim 1, wherein the optical arrangement comprises an optical collimation structure arranged between the lasers and the diffusor, and wherein the optical collimation structure is arranged to collimate the laser light such that the diffusor transforms the collimated laser light to transformed laser light.

17. A light emitting device comprising at least one laser arrangement according to claim 1 and an electrical driver for providing an electrical drive current to the lasers.

18. A time-of-flight camera comprising:
the light emitting device according to claim 17; and
a light detector for detecting the transformed laser light reflected by an object and an evaluator,
wherein the evaluator is configured to determine a distance to the object based on the transformed laser light detected by the light detector.

19. A method of fabricating a laser arrangement, the method comprising:
providing a laser array,
wherein the laser array comprises a multitude of lasers arranged in a first regular pattern, and
wherein each laser, of the lasers, is arranged to emit a same laser emission profile around a first optical axis with a divergence angle $\theta/2$ with respect to the first optical axis in at least one direction perpendicular to the first optical axis;
providing an optical arrangement,
wherein the optical arrangement comprises a diffusor,
wherein the diffusor comprises an array of optical elements arranged in a second regular pattern, and
wherein each of the optical elements comprises a second optical axis;
arranging each of the optical elements to provide a defined illumination pattern along at least one first illumination axis in a reference plane in a defined field-of-view in a condition where laser light is received within a defined range of angles by each surface element of the respective optical element, of the optical elements,
wherein the defined range of angles is smaller than or equal to a range of angles between $-\theta$ and $+\theta$ with respect to the second optical axis;
arranging the lasers and the optical elements relative to each other such that the diffusor transforms laser light received from the lasers to transformed light,
wherein an emission characteristic of the transformed light along the first illumination axis in the reference plane in the defined field-of-view is characterized by same characteristics as the defined illumination pattern;
arranging at least one first row of lasers comprising at least n lasers, of the lasers, along a first axis parallel to the first illumination axis with a laser pitch p;
arranging at least one first row of optical elements comprising at least m optical elements, of the optical elements, parallel to the first axis,
wherein each of the optical elements is characterized by a diameter L parallel to the first axis, and
wherein each of the optical elements is in physical contact with a neighboring optical element, of the optical elements, such that a total length of the first row of optical elements parallel to the first axis is given by the number of optical elements multiplied with the diameter L; and
arranging the first row of optical elements to receive the laser light from the first row of lasers during operation of the first row of lasers,
wherein a diameter of the laser light emitted by the lasers along the first axis in a reference plane of the optical elements is given by $\Phi$, wherein the n lasers and the m optical elements fulfill a pitch match condition where n*p is within a deviation smaller than +/−5% of m*L, and
wherein n and m are not equal and deviate by an integer number.

* * * * *